(12) United States Patent
Min (10) Patent No.: US 7,858,505 B2
(45) Date of Patent: Dec. 28, 2010

(54) METHOD OF FORMING A TRANSISTOR HAVING MULTIPLE TYPES OF SCHOTTKY JUNCTIONS

(75) Inventor: Byoung W. Min, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 871 days.

(21) Appl. No.: 11/744,638

(22) Filed: May 4, 2007

(65) Prior Publication Data

US 2008/0274601 A1  Nov. 6, 2008

(51) Int. Cl.
  *H01L 21/28* (2006.01)
  *H01L 21/44* (2006.01)
(52) U.S. Cl. .................. 438/570; 257/E21.425
(58) Field of Classification Search .......... 438/750; 257/E21.425
   See application file for complete search history.

(56) References Cited

U.S. PATENT DOCUMENTS

| 4,875,082 | A | 10/1989 | Bredthauer |
| 5,283,202 | A | 2/1994 | Pike, Jr. et al. |
| 6,303,479 | B1 | 10/2001 | Snyder |
| 6,339,005 | B1 | 1/2002 | Bryant et al. |
| 6,376,342 | B1 | 4/2002 | Tseng |
| 6,509,609 | B1 | 1/2003 | Zhang et al. |
| 2006/0079044 | A1* | 4/2006 | Shibata et al. ............... 438/197 |
| 2006/0091490 | A1* | 5/2006 | Chen et al. .................. 257/458 |
| 2006/0175667 | A1* | 8/2006 | Tsuchiaki .................... 257/391 |

OTHER PUBLICATIONS

Kim, Y.H. et al.; "Tunable Workfunction for Fully Silicided Gates (FUSI) and Proposed Mechanisms"; IEEE; 2006; pp. 1-2; IEEE.

Yu, H.Y. et al.; "Demonstration of a New Approach towards 0.25V Low-V, CMOS using Ni-based FUSI" 2006 Symposium on VLSI Technology Digest of Technical Papers; 2006; 2 pgs.; IEEE.

Kinoshita, A. et al.; "High-performance 50-nm-Gate-Length Schottky-Source/Drain MOSFETs with Dopant-Segregation Junctions"; 2005 Symposium on VLSI Technology Digest of Technical Papers; pp. 158-159; 2005.

Li, D. et al. "Novel Schottky Barrier MOSFET with Dual-layer Silicide Source/Drain Structure"; 2004; pp. 69-72; IEEE.

Kinoshita A.; "Solution for High-Performance Schottky-Source/Drain MOSFETS: Schottky Barrier Height Engineering with Dopant Segregation Technique"; 2004 Symposium on VLSI Technology Digest of Technical Papers; 2004; pp. 168-169; IEEE.

PCT/US2008/059739 International Search Report mailed Jul. 30, 2008.

* cited by examiner

*Primary Examiner*—David A. Zameke
*Assistant Examiner*—Igwe U Anya
(74) *Attorney, Agent, or Firm*—Kim-Marie Vo (57) ABSTRACT

A gate electrode is formed overlying a substrate. A first angled metal implant is performed at a first angle into the substrate followed by performing a second angled metal implant at a second angle. The first angled metal implant and the second angled metal implant form a first current electrode and a second current electrode. Each of the first current electrode and the second current electrode has at least two regions of differing metal composition. A metal layer is deposited overlying the gate electrode, the first current electrode and the second current electrode. The metal layer is annealed to form two Schottky junctions in each of the first current electrode and the second current electrode. The two Schottky junctions have differing barrier levels.

9 Claims, 7 Drawing Sheets

METHOD OF FORMING A TRANSISTOR HAVING MULTIPLE TYPES OF SCHOTTKY JUNCTIONS

BACKGROUND

1. Field

This disclosure relates generally to semiconductors, and more specifically, to a process for manufacturing transistors having Schottky junctions.

2. Related Art

Transistors having Schottky junctions have been proposed for future use due to having advantages over conventional PN junctions found in presently commercialized metal oxide semiconductor (MOS) transistors. For example, control of the source/drain dimensions is more accurate because the source/drain composition is metal or a metal alloy which are formed at lower temperatures. As a result of the composition of the source and drain electrodes of Schottky junction transistors, the conductivity of these electrodes is improved over conventional transistor semiconductor materials. Therefore, the resistance of the source and drain electrodes in Schottky junction transistors is less and this is an important feature. As transistor channel dimensions continue to become ever smaller, the resistance associated with conventional source/drain semiconductor materials is becoming more significant and detrimental to the performance of the transistor.

Transistors having Schottky junctions that have been proposed typically involve numerous process steps to form. Some of the process steps require additional masking layers and selective etching of small-dimensioned materials. Thus such proposed structures have significant manufacturing costs or reliability issues.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
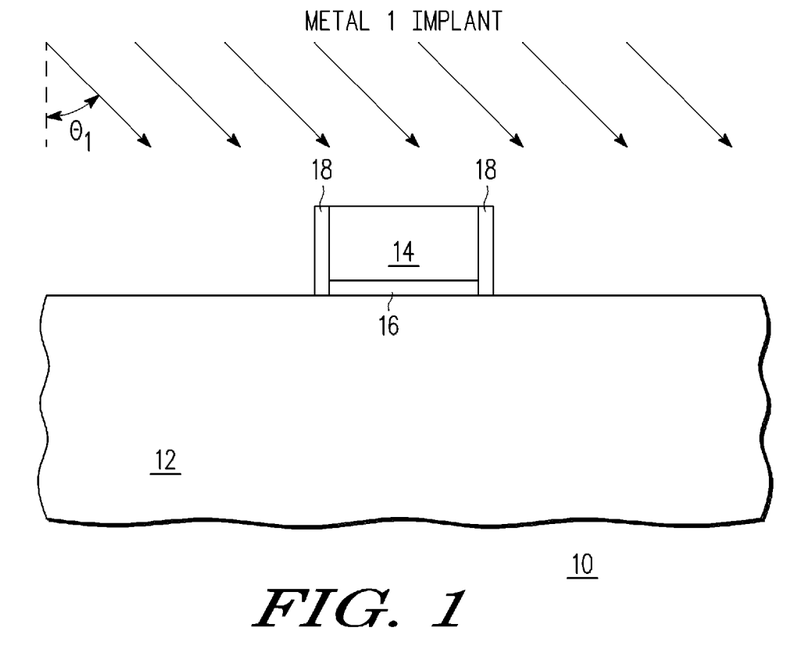
FIGS. 1-6 illustrate in cross-sectional form a semiconductor transistor created by one form of a method in accordance with the present invention.

Illustrated in FIG. 1 is a cross-sectional view of a process for making a transistor 10. In the illustrated form the transistor 10 is a metal oxide semiconductor (MOS) transistor. A semiconductor substrate 12 is initially provided. In one form the semiconductor substrate 12 is a silicon substrate. In other forms the semiconductor substrate 12 may be a silicon well region. However, the semiconductor substrate 12 can be any semiconductor material or combinations of materials, such as gallium arsenide, silicon germanium, silicon-on-insulator (SOI), silicon, monocrystalline silicon, and combinations of the above. Overlying the semiconductor substrate 12 is a gate dielectric layer 16. In one form the gate dielectric layer 16 is an oxide such as silicon dioxide and is thermally grown on semiconductor substrate 12 when the semiconductor substrate 12 is silicon. In other forms the gate dielectric layer 16 may be implemented with any of various high-K or high permittivity dielectric materials. It should be appreciated that the drawings discussed herein are not necessarily proportioned to size for purposes of explanation. Transistor 10 further has a gate 14 overlying the gate dielectric layer 16. The gate 14 is typically deposited and patterned. In one form the gate 14 is made with metal content. For example, a gate material such as silicide or highly doped polysilicon may be used. Surrounding the sidewalls of the gate 14 is a gate insulating liner 18. In one form the gate insulating liner is created by deposition and is silicon oxide. It should be well understood that other gate materials and gate insulating materials may be used.

The transistor 10 is subjected to a first metal implant labeled "Metal 1 Implant". The Metal 1 implant is an angled implant at an implant of $\theta_1$ relative to a vertical reference. The Metal 1 implant is an implant a predetermined metal. In one form, any of Ytterbium (Yb), boron (B) or Platinum (Pt) is implanted with the angled implant. The Metal 1 implant is performed for an amount of time that is dependent upon various processing factors including the temperature, pressure and desired resulting dimensions to be discussed below.

Figure 2:
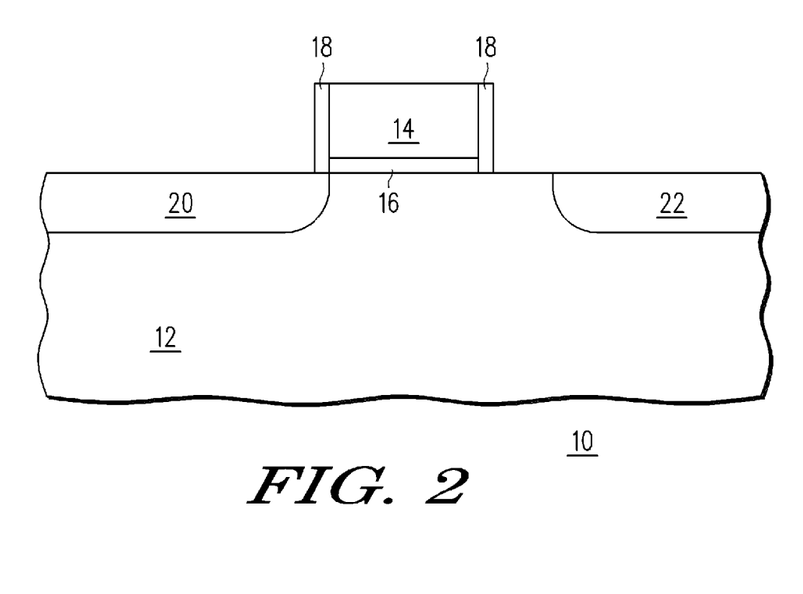

Illustrated in FIG. 2 is further processing of transistor 10 in which a first current electrode 20 and a second current electrode 22 are formed as a result of the Metal 1 implant step. The angled nature of the Metal 1 implant results in an offset or space existing between an edge of the second current electrode 22 and the gate 14. The reason for the offset is that the gate 14 blocks the angled implant in the edge of the second current electrode 22 and the gate 14. Additionally, the first current electrode 20 is formed underlying a portion of the gate insulating liner 18. The first current electrode 20 and the second current electrode 22 are otherwise substantially symmetrical and have substantially a same depth within the semiconductor substrate 12. Whether the first current electrode 20 and the second current electrode 22 are source and drain electrodes or vice-versa depends upon whether an N-channel transistor or a P-channel transistor is being implemented.

Figure 3:
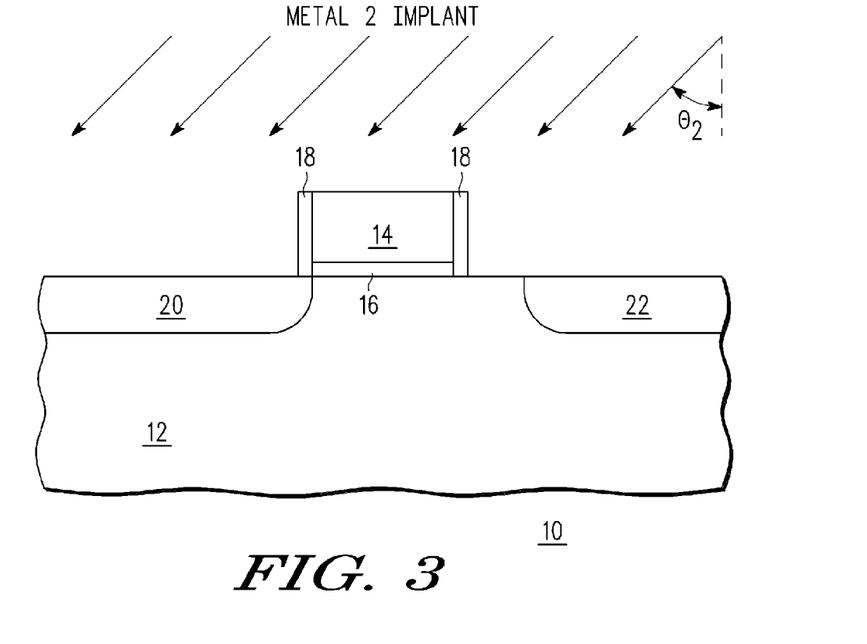

Illustrated in FIG. 3 is further processing of transistor 10 in which a second metal implant, labeled "Metal 2 Implant", is performed. The second metal implant is performed at an angle of $\theta_2$ which is substantially the same as the angle $\theta_1$. Various angles may be used to implement the noted angle implants. By way of illustration only, a range of angles from approximately thirty degrees to sixty degrees may be implemented. Angles which are outside of this range may however also be used depending upon the gate structure of the transistor and the thickness of liners and adjoining sidewall spacers, if any. It should be noted however that angle $\theta_1$ may differ from angle $\theta_2$ within a predetermined amount dependent upon factors such as the doping species, desired structural dimensions and processing parameters. The Metal 2 implant is a different doping species than the Metal 1 implant in order to create a different Schottky junction as will be explained below. The Metal 2 implant is implemented with any of Erbium (Er), Arsenic (As) or Aluminum (Al). It should be understood that the metals provided for the Metal 2 implant may be reversed with those provided for the Metal 1 implant.

Figure 4:
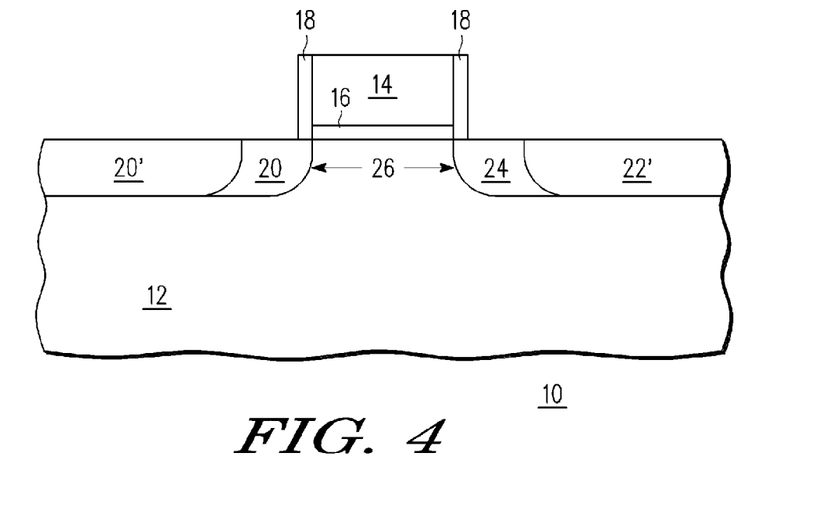

Illustrated in FIG. 4 is further processing of transistor 10 after the two differing metal implants have been implemented. The first current electrode 20 is modified in its composition to include a first region immediately adjacent a channel 26 that contains the original composition as first current electrode 20. A laterally adjacent region further removed from the channel 26 is modified by the Metal 2 implant and now has a composition designated as first current electrode 20'. Both first current electrode 20 and first current electrode 20' are electrically and physically connected and collectively function as a first current electrode. Similarly, the second current electrode 22 is modified in its composition to include a first region 24 immediately adjacent the channel 26. A laterally adjacent region further removed from the channel 26 is modified by the Metal 2 implant and now has a composition designated as second current electrode 22'. Both region 24 and second current electrode 22' are electrically and physically connected and collectively function as a second current electrode.

Figure 5:
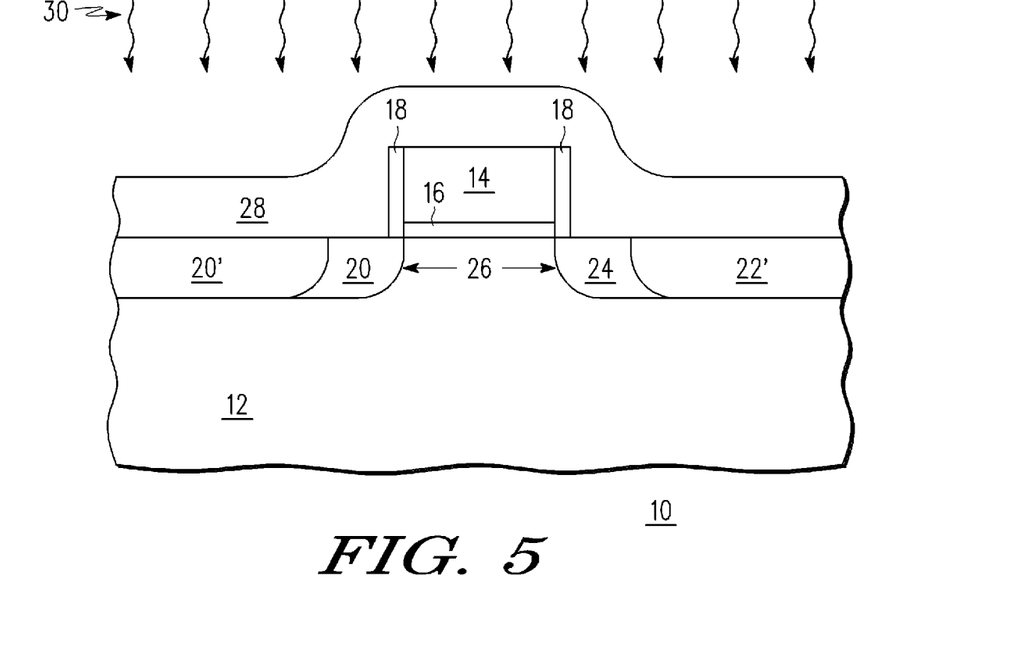

Illustrated in FIG. 5 is further processing of transistor 10. A conductive metal layer 28 is formed overlying the transistor 10. A conformal deposition of a metal is performed to form metal layer 28. In one form the composition of metal layer 28 is any one of copper, nickel, titanium, tungsten and alloys thereof may be used. Other suitable metals may also be used. An anneal 30 of the transistor 10 is performed to modify the composition of the first current electrode and the second current electrode by reacting metal from the metal layer 28. Annealing or curing the overlying metal layer forms a silicide with the existing materials of the first current electrode and the second current electrode and activates the dopants previously implanted. The temperature of the anneal 30 is a low temperature anneal and is typically in a range of 350 degrees Celsius to 500 degrees Celsius. Also the anneal 30 may be a multiple step anneal rather than a single step process. The time required for the anneal varies depending upon materials selected and other processing parameters. Un-reacted metal of the metal layer 28 is removed by a conventional dry etch or wet etch.

Figure 6:
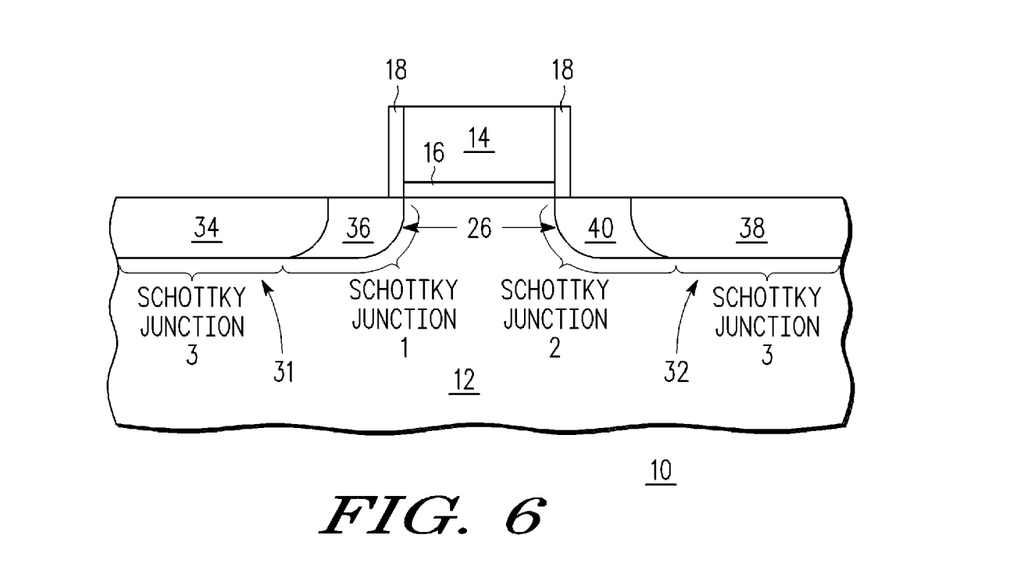

Illustrated in FIG. 6 is a cross-sectional of further processing of transistor 10. The first current electrode has become a first current electrode 31 having a first region 36 immediately adjacent the channel 26. The second current electrode has become an electrode 32 having a first region 40 immediately adjacent the channel 26 and a second region 38. Laterally adjacent the first region 36 and further away from the channel 26 is a second region 34 that is another portion of the first current electrode 31. Because of the metal/semiconductor interface, a Schottky junction exists at the junction between first region 36 and semiconductor substrate 12 and the junction between second region 34 and semiconductor substrate 12. A Schottky junction is an interface between a metal and a semiconductor material that exhibits a nonlinear impedance. The Schottky junction between first region 36 and semiconductor substrate 12 is a first Schottky junction, and a second Schottky junction is formed between semiconductor substrate 12 and the region 40 of the second current electrode. A third Schottky junction is formed between the semiconductor substrate and each of the region 34 of the first current electrode 31 and the region 38 of the second current electrode 32. All three of the Schottky junctions have differing barrier levels due to the differing metal content of first region 36, region 40 and regions 34 and 38. The third Schottky junction typically has a barrier level that is between the barrier level of first Schottky junction and the second Schottky junction. In this form the second Schottky junction is greater than the first Schottky junction when the first current electrode 31 is a source and current electrode 32 is a drain. The lower barrier height of the first Schottky junction reduces a parasitic resistance naturally occurring from the first current electrode 31 into the channel under on-state bias conditions of the gate. However, the higher barrier of the second Schottky junction will prevent leakage current from making the transistor conductive under off-state bias conditions. Thus an efficient transistor having leakage current immunity has been provided. The asymmetry associated with the differing values of the Schottky junctions between the substrate (or well) and the current electrodes is provided with simplified processing. In particular, the asymmetry between the first Schottky junction barrier and the second Schottky junction barrier is provided by using angled ion implantation steps. More costly and unreliable processing such as deposition and selective etching has been avoided.

Figure 7:
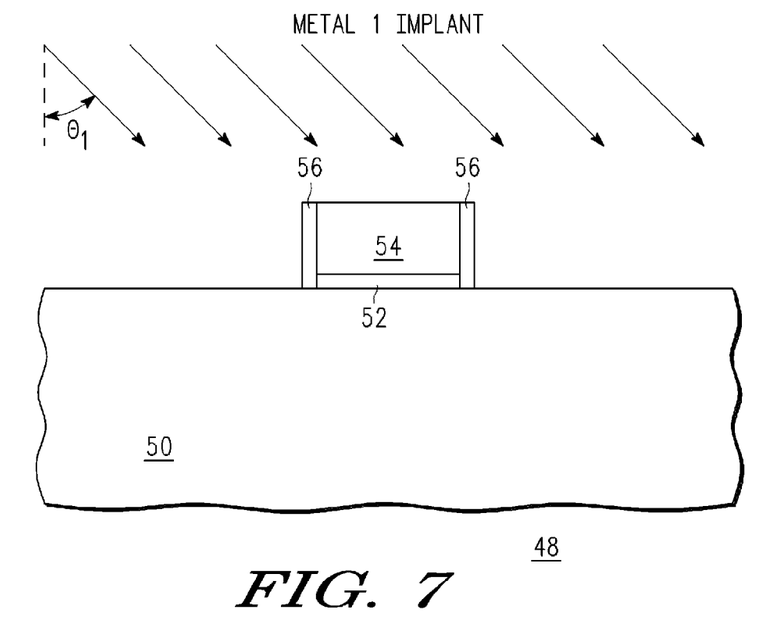
FIGS. 7-14 illustrate in cross-sectional form a semiconductor transistor created by another form of a method in accordance with the present invention.

Illustrated in FIG. 7 is a cross-sectional view of a transistor 48 formed in accordance with another form of the present invention. Transistor 48 has a substrate 50. Overlying the substrate in a location where a gate is desired is a patterned gate oxide layer 52. Overlying the gate oxide layer 52 is a gate 54. Adjacent the sidewall of the gate 54 all around the gate 54 is an insulating liner 56. In one form the gate oxide layer 52 and the insulating liner 56 are formed of silicon oxide. Other insulating materials may be used. A first metal implant that is an angled ion implantation of a predetermined metal is performed. The angle of the implant is designated as having an angle $\theta_1$ relative to a vertical reference. The Metal 1 implant is an implant a predetermined metal. In one form, any of Ytterbium (Yb), boron (B) or Platinum (Pt) is implanted with the angled implant. The Metal 1 implant is performed for an amount of time that is dependent upon various processing factors including the temperature, pressure and desired resulting dimensions to be discussed below.

Figure 8:
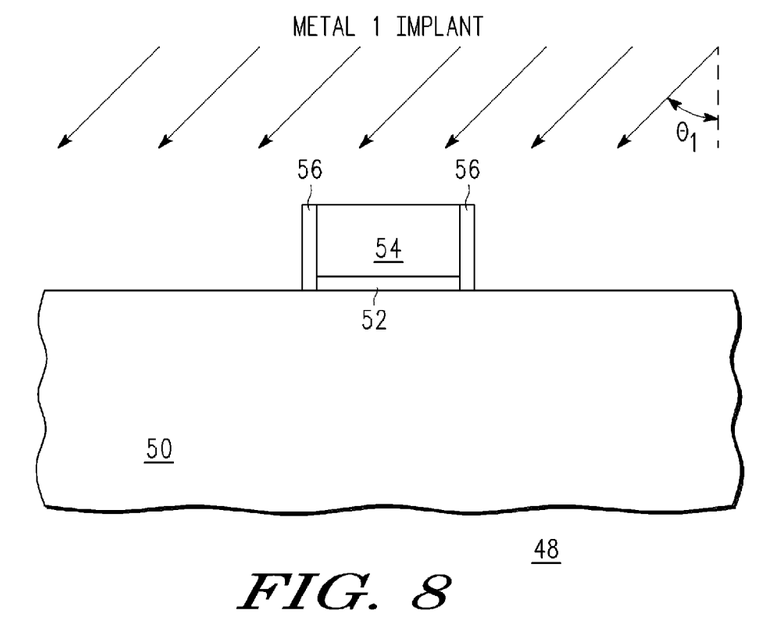

Illustrated in FIG. 8 is further processing of transistor 48 wherein further ion implanting of the first metal occurs, but in an opposite direction from that shown in FIG. 7. The angle $\theta_1$ of the ion implantation remains the same as used in FIG. 7 and is accomplished by rotating the transistor 48 on a pedestal (not shown). Therefore, the ion implant illustrated in FIGS. 7 and 8 is one continuous ion implant step. The length of the ion implant is application specific and depends upon the metal selected and the desired dimensions of the resulting implanted features.

Figure 9:
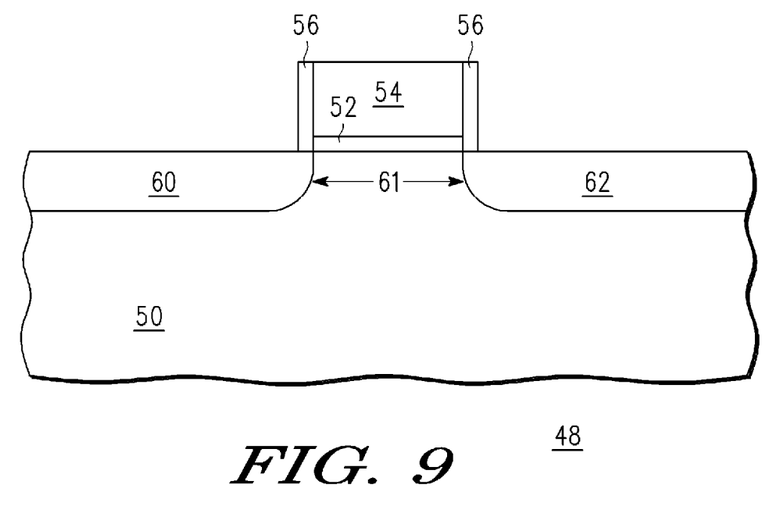

Illustrated in FIG. 9 is further processing of transistor 48 wherein a first current electrode 60 and a second current electrode 62 of the transistor 48 have been formed. A channel 61 separates the first current electrode 60 from the second current electrode 62. Due to the angled nature of the ion implantation, each of the first current electrode 60 and second current electrode 62 extends under the insulating liner 56.

Figure 10:
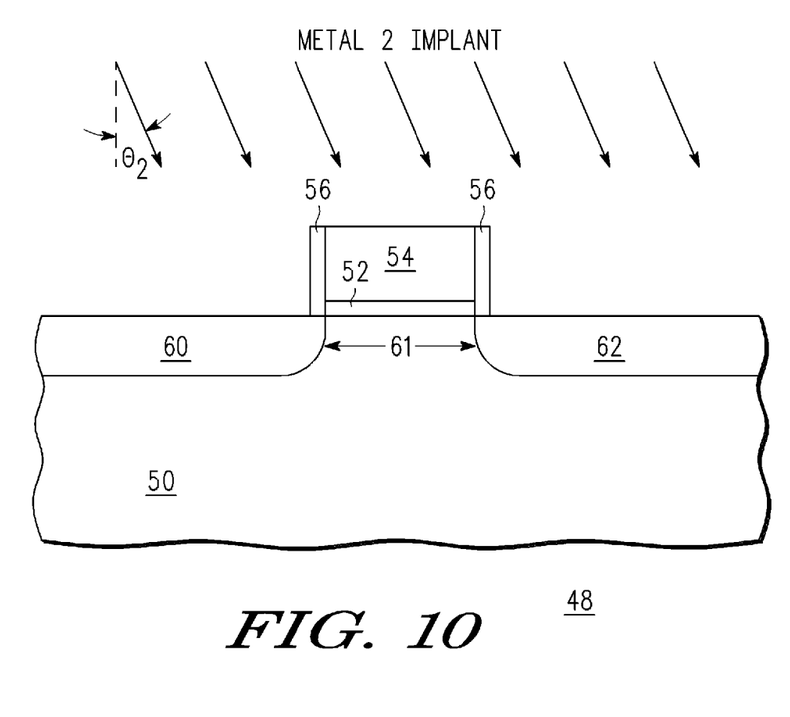

Illustrated in FIG. 10 is further processing of transistor 48 wherein a second metal implant at an angle $\theta_2$ relative to a vertical reference is performed. It should be noted that angle $\theta_2$ does differ from angle $\theta_1$. The angle $\theta_2$ ranges from zero to an angle that is smaller or less than the angle $\theta_1$. As in the first described embodiment, the Metal 2 implant is a different doping species than the Metal 1 implant in order to create a different Schottky junction as will be explained below. The Metal 2 implant is implemented with any of Erbium (Er), Arsenic (As) or Aluminum (Al). It should be understood that the metals provided for the Metal 2 implant may be reversed with those provided for the Metal 1 implant.

Figure 11:
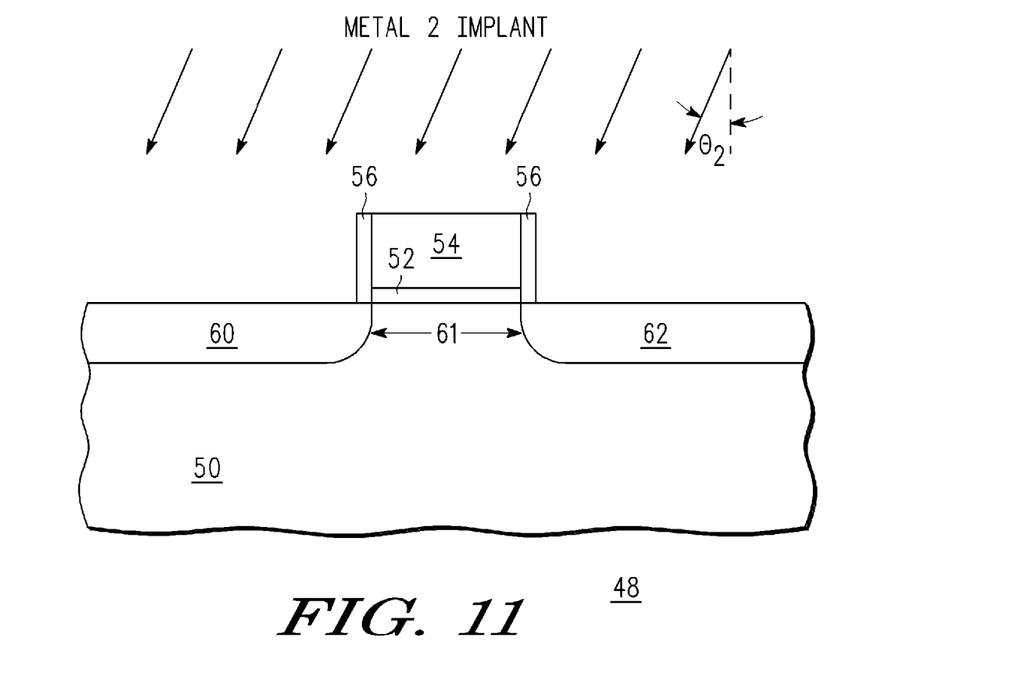

Illustrated in FIG. 11 is further processing of transistor 48 wherein further ion implanting of the second metal occurs, but in an opposite direction from that shown in FIG. 10. The angle $\theta_2$ of the ion implantation remains the same as used in FIG. 10 and is accomplished by rotating the transistor 48 on a pedestal (not shown). Therefore, the ion implant illustrated in FIGS. 10 and 11 is one continuous ion implant step. The length of the ion implant is application specific and depends upon the metal selected and the desired dimensions of the resulting implanted features.

Figure 12:
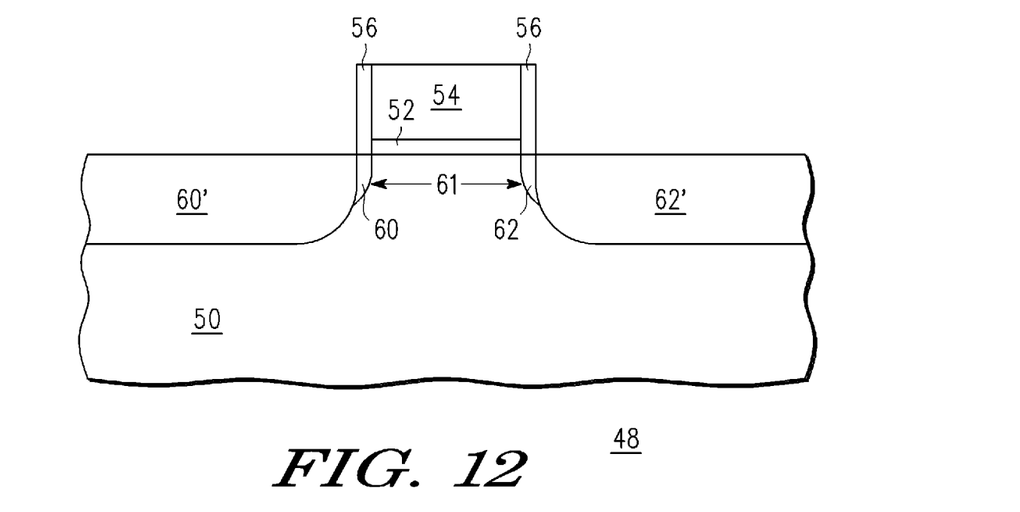

Illustrated in FIG. 12 is further processing of transistor 48 in which a resulting structure from the two differing metal ion implantations at differing angles is completed. Transistor 48 now has modified first current electrode and second current electrode structures. The first current electrode 60 is now formed of two regions respectively labeled 60 and 60'. In the region labeled with number 60, no material change of the composition of the first current electrode 60 has occurred. In the region labeled with number 60', a change in the composition of the first current electrode occurred from the metal 2 implant. Similarly, the second current electrode 62 is now formed of two regions respectively labeled 62 and 62'. In the region labeled with number 62, no material change of the composition of the first current electrode 62 has occurred. In the region labeled with number 62', a change in the composition of the second current electrode occurred from the metal 2 implant. Therefore, within each current electrode of transistor 48 there is asymmetry of composition while there is symmetry between the first current electrode and the second current electrode. Which of the two current electrodes functions as a source and which functions as a drain is dependent upon conductivity of the channel region 61.

Figures 13, 14:
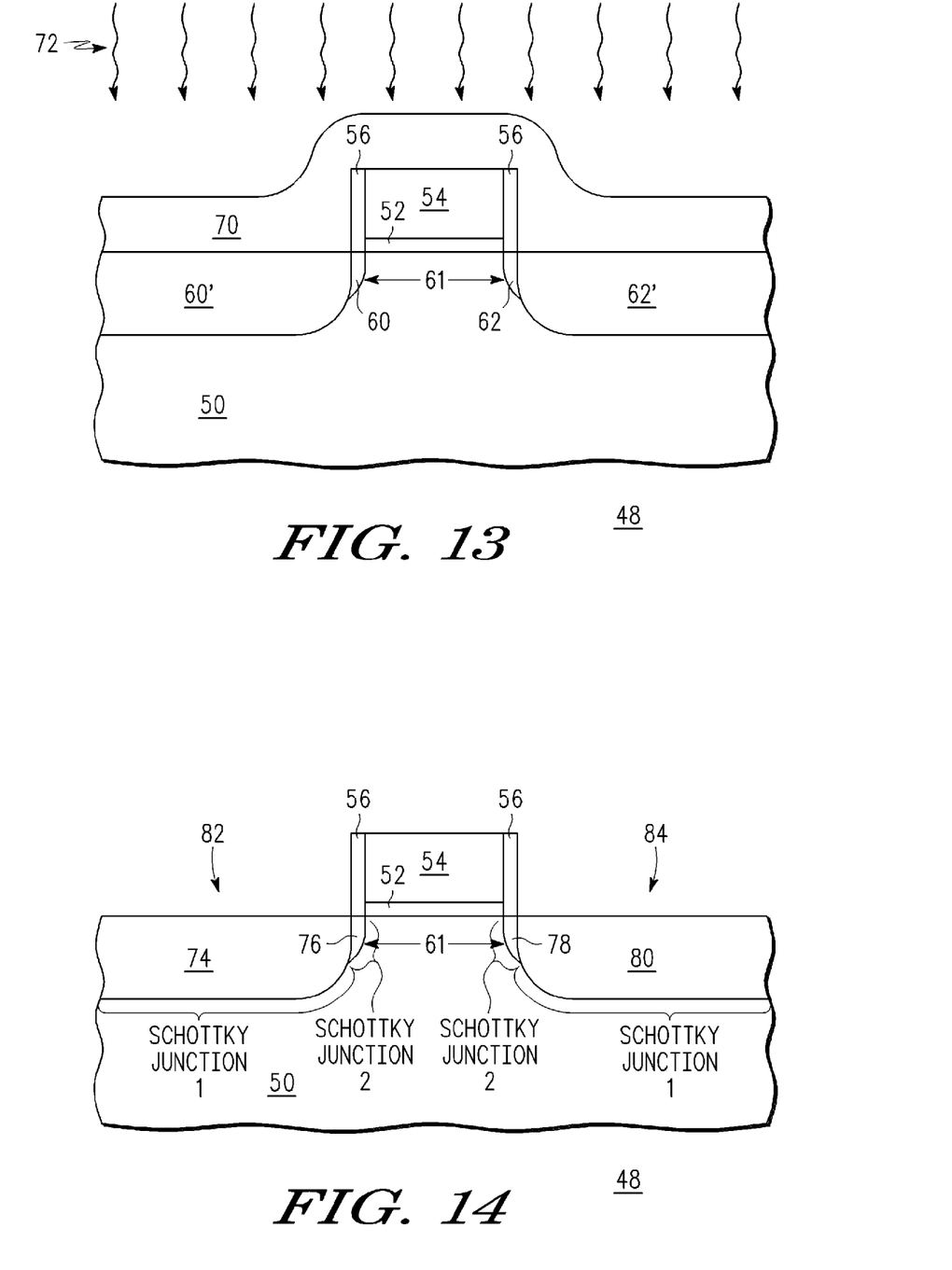

Illustrated in FIG. 13 is further processing of transistor 48. A conformal deposition of a metal is performed to form metal layer 70. In one form the composition of metal layer 70 is any of copper, nickel, titanium, tungsten and alloys thereof. An anneal 72 is performed for a predetermined amount of time to both activate the dopants previously implanted into the first current electrode and the second current electrode and to form a silicide within the first current electrode and the second current electrode by reacting metal from the metal layer 70. A typical annealing temperature in the range of anywhere from three hundred fifty degrees Celsius to five hundred degrees Celsius. However, temperatures outside of this range may be implemented. Un-reacted metal of the metal layer 70 is then removed by a conventional dry etch or wet etch.

Illustrated in FIG. 14 is further processing of transistor 48 in which current electrodes are formed having portions with Schottky junctions having differing barrier levels or heights. A first Schottky junction is identified in connection with a first current electrode 82 that is primarily at the interface of the bottom surface of region 74 and semiconductor substrate 50. A second Schottky junction is identified in connection with the first current electrode 82. The second Schottky junction is at the interface of region 76 and the channel 61. The first Schottky junction barrier height has been modulated by the metal implants to be greater than the second Schottky junction barrier height. As a result, leakage current from the first current electrode 82 to the substrate 50 is largely impeded. The second Schottky junction barrier height is less than the first Schottky junction barrier height. As a result of this asymmetry in each of the first current electrode and the second current electrode, a faster transistor is provided. However, the transistor 48 has significant protection from current leakage to the bulk or substrate 50 as a result of the relevant Schottky junction interfaces having greater barrier height. Thus an undesired and unnecessary current leakage component of transistor 48 is eliminated. It should be noted that the asymmetry in Schottky barrier levels is within each current electrode. The first current electrode is however symmetric with the second current electrode. It should also be appreciated that the first current electrode may function as a source or a drain depending upon whether an N-channel transistor or a P-channel transistor is implemented. In a similar manner but complementary manner, transistor 48 has a second current electrode 84 that has a region 80 and a region 78. Each of region 80 and region 78 has a Schottky junction at an interface with the substrate 50. The Schottky junction at the interface of region 80 and substrate 50 has a barrier height labeled "Schottky junction 1" which is the same as associated with region 74 and substrate 50. The Schottky junction at the interface of region 78 and substrate 50 has a barrier height labeled "Schottky junction 2" which is the same as associated with region 76 and substrate 50.

By now it should be appreciated that there has been provided a method for forming a transistor that utilizes Schottky junctions to selectively minimize current leakage. An asymmetric ion implantation is used to form current electrodes having regions with differing Schottky junction barrier heights. Metal ion implants are used to reliably modulate the barrier heights of relevant Schottky junctions associated with the current electrodes of the transistor. Selective use of angled ion implants with non-angled ion implants permit a reliable implementation of the barrier height modulation. Embodiments that are discussed apply to both N-channel transistors and P-channel transistors. Numerous embodiments described herein may be used and the selection of which embodiment may depend upon processing requirements and desired transistor specifications.

Although the invention has been described with respect to specific conductivity types or polarity of potentials, skilled artisans appreciated that conductivity types and polarities of potentials may be reversed. Moreover, the terms "front," "back," "top," "bottom," "over," "under", "above", "below" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the method may be used to form other semiconductor devices in addition to transistors. For example, the transistors described herein may utilize gate sidewall spacers in addition to a gate insulating liner such as insulating liner 56. The use of sidewall spacers may permit increased control of the lateral dimensions of regions 76 and 78 of FIG. 14. The sidewall spacers may be either permanent or disposable. It should be well understood that while specific metals have been recited in connection with the first metal implant and the second metal implant, additional metals may be used depending upon the processing parameters and materials that exist. Also, various semiconductor materials may be used for other elements of the transistors described herein in addition to the materials specifically listed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

In one form there is herein provided a method in which a gate is formed overlying a substrate. A first angled metal implant is performed at a first angle into the substrate followed by performing a second angled metal implant at a second angle. The first angled metal implant and the second angled metal implant form a first current electrode and a second current electrode. Each of the first current electrode and the second current electrode has at least two regions of differing metal composition. A metal layer is deposited overlying the gate electrode, the first current electrode and the second current electrode. The metal layer is annealed to form two Schottky junctions in each of the first current electrode and the second current electrode. The two Schottky junctions have differing barrier levels. In one form the first angle and the second angle are implemented as substantially a same angle relative to a vertical reference. In another form the first current electrode has at least two regions of differing metal composition. A first region of a first metal composition is formed having a first Schottky junction at a first interface of a lower surface of the first current electrode and the substrate. A second region of a second metal composition is formed having a second Schottky junction at a second interface of a channel edge surface of the first current electrode and the substrate.

In another form the first Schottky junction has a higher Schottky barrier height than the second Schottky junction. In yet another form the first angled metal implant and the second angled metal implant are from differing directions. In one form each of the first angled metal implant and the second angled metal implant are performed by implanting from two substantially opposite directions, the first angle differing from the second angle. In another form the first current electrode and the second current electrode are formed having at least two regions of differing metal composition by forming the first current electrode with a first region and a second region. The first region has a first Schottky junction having a first Schottky barrier height. The second region has a second Schottky junction having a second Schottky barrier height. The second current electrode is formed with a first region and a second region. The first region has a third Schottky junction having a third Schottky barrier height. The second region has a second Schottky junction having the second Schottky barrier height. In another form the first Schottky barrier height is less than the third Schottky barrier height.

In another form there is provided a method of forming a transistor by forming a gate electrode overlying a substrate. A first angled metal implant is performed at a first angle into the substrate followed by performing a second angled metal implant at a second angle. The first angled metal implant and the second angled metal implant are from differing directions and form a first current electrode and a second current electrode. Each of the first current electrode and the second current electrode has at least two regions of differing metal composition. The first current electrode has a composition that is asymmetric with the second current electrode. A metal layer is deposited overlying the gate electrode, the first current electrode and the second current electrode. The metal layer is annealed to form two Schottky junctions in each of the first current electrode and the second current electrode. The two Schottky junctions have differing barrier levels. In another form the first angle and the second angle are implemented as substantially a same angle relative to a vertical reference. In another form the first current electrode has at least two regions of differing metal composition by forming a first region of a first metal composition having a first Schottky junction at a first interface of a lower surface of the first current electrode and the substrate. A second region of a second metal composition is formed having a second Schottky junction at a second interface of a channel edge surface and the substrate. In another form the first Schottky junction has a higher Schottky barrier height than the second Schottky junction. In another form the first current electrode and the second current electrode have at least two regions of differing metal composition by forming the first current electrode with a first region having a first Schottky junction having a first Schottky barrier height. The first current electrode is formed with a second region having a second Schottky junction having a second Schottky barrier height. The second current electrode is formed with a first region having a third Schottky junction having a third Schottky barrier height. The second current electrode is formed with a second region having a second Schottky junction having the second Schottky barrier height. In another form the first Schottky barrier height is less than the third Schottky barrier height.

In yet another form there is provided a method for providing a transistor by forming a gate electrode overlying a substrate. A first angled metal implant is performed at a first angle into the substrate and from a first direction. A second angled metal implant is performed at the first angle into the substrate but from a second direction different than the first direction. The first angled metal implant and the second angled metal implant form a first current electrode and a second current electrode within the substrate. A third angled metal implant into the substrate is performed at a second angle that is less than the first angle and from a third direction. A fourth angled metal implant at the second angle into the substrate is performed but from a fourth direction different than the third direction. Each of the first current electrode and the second current electrode has at least two regions of differing metal composition. The first current electrode has a composition that is symmetric with the second current electrode. A metal layer is deposited overlying the gate electrode, the first current electrode and the second current electrode. The metal layer is annealed to form two Schottky junctions in each of the first current electrode and the second current electrode. The two Schottky junctions have differing barrier levels. In another form the first direction is substantially opposite to the second direction. In another form a first of the two Schottky junctions in each of the first current electrode and the second current electrode is adjacent a channel region underlying the gate electrode and have substantially a same barrier height. In another embodiment forming the first current electrode is performed by forming a first region of a first metal composition having a first Schottky junction at a first interface of a lower surface of the first current electrode and the substrate. A second region of a second metal composition is formed having a second Schottky junction at a second interface of a channel edge surface of the first current electrode and the substrate. In another embodiment performing each of the first angled metal implant and the second angled metal implant is implemented by performing an angled metal implant using one of Itrium, Boron or Platinum. In another form performing each of the third angled metal implant and the fourth angled metal implant is implemented by performing an angled metal implant using one of Erbium, Arsenic or Aluminum.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A method comprising:
providing a substrate;
forming a gate electrode overlying the substrate;
performing a first angled metal implant at a first angle into the substrate and from a first direction;

performing a second angled metal implant at the first angle into the substrate but from a second direction different than the first direction, the first angled metal implant and the second angled metal implant forming a first current electrode and a second current electrode within the substrate;

performing a third angled metal implant into the substrate at a second angle that is less than the first angle and from a third direction;

performing a fourth angled metal implant at the second angle into the substrate but from a fourth direction different than the third direction, each of the first current electrode and the second current electrode having at least two regions of differing metal composition, the first current electrode having a composition that is symmetric with the second current electrode;

depositing a metal layer overlying the gate electrode, the first current electrode and the second current electrode; and annealing the metal layer to form two Schottky junctions in each of the first current electrode and the second current electrode, the two Schottky junctions having differing barrier levels.

2. The method of claim 1 wherein forming the first current electrode and the second current electrode further comprises:

forming the first current electrode with a first region having a first Schottky junction having a first Schottky barrier height;

forming the first current electrode with a second region having a second Schottky junction having a second Schottky barrier height;

forming the second current electrode with a first region having a third Schottky junction having a third Schottky barrier height; and forming the second current electrode with a second region having a second Schottky junction having the second Schottky barrier height.

3. The method of claim 2 wherein the first Schottky barrier height is less than the third Schottky barrier height.

4. The method of claim 1 further comprising:
implementing the first direction substantially opposite to the second direction.

5. The method of claim 1 wherein a first of the two Schottky junctions in each of the first current electrode and the second current electrode is adjacent a channel region underlying the gate electrode and have substantially a same barrier height.

6. The method of claim 1 wherein forming the first current electrode further comprises:

forming a first region of a first metal composition having a first Schottky junction at a first interface of a lower surface of the first current electrode and the substrate; and forming a second region of a second metal composition having a second Schottky junction at a second interface of a channel edge surface of the first current electrode and the substrate.

7. The method of claim 6 wherein the first Schottky junction has a higher Schottky barrier height than the second Schottky junction.

8. The method of claim 1 wherein performing each of the first angled metal implant and the second angled metal implant further comprises:

performing an angled metal implant using a metal consisting of the group of Itrium, Boron and Platinum.

9. The method of claim 1 wherein performing each of the third angled metal implant and the fourth angled metal implant further comprises:

performing an angled metal implant using a metal consisting of the group of Erbium, Arsenic and Aluminum.

* * * * *